(12) United States Patent
Zou et al.

(10) Patent No.: US 11,249,163 B2
(45) Date of Patent: Feb. 15, 2022

(54) EDDY-CURRENT CORRECTION METHOD AND APPARATUS, MOBILE TERMINAL AND READABLE STORAGE MEDIUM

(71) Applicant: SHENZHEN INSTITUTES OF ADVANCED TECHNOLOGY, Shenzhen (CN)

(72) Inventors: Chao Zou, Shenzhen (CN); Chuanli Cheng, Shenzhen (CN); Xin Liu, Shenzhen (CN); Hairong Zheng, Shenzhen (CN)

(73) Assignee: SHENZHEN INSTITUTES OF ADVANCED TECHNOLOGY, Shenzhen (CN)

( * ) Notice: Subject to any disclaimer, the term of this patent is extended or adjusted under 35 U.S.C. 154(b) by 127 days.

(21) Appl. No.: 16/977,818

(22) PCT Filed: Nov. 27, 2017

(86) PCT No.: PCT/CN2017/113085
§ 371 (c)(1),
(2) Date: Sep. 3, 2020

(87) PCT Pub. No.: WO2019/100373
PCT Pub. Date: May 31, 2019

(65) Prior Publication Data
US 2021/0396829 A1    Dec. 23, 2021

(51) Int. Cl.
*G01R 33/565* (2006.01)
*G01R 33/561* (2006.01)
(Continued)

(52) U.S. Cl.
CPC ... *G01R 33/56518* (2013.01); *G01R 33/4828* (2013.01); *G01R 33/5608* (2013.01); *G01R 33/5616* (2013.01)

(58) Field of Classification Search
USPC .............................................. 324/9
See application file for complete search history.

(56) References Cited

U.S. PATENT DOCUMENTS 5,869,965 A * 2/1999 Du .................. G01R 33/56581
324/309
5,917,323 A * 6/1999 Du .................. G01R 33/56554
324/309
(Continued)

FOREIGN PATENT DOCUMENTS

CN        1171921 A     2/1998
CN      105809661 A     7/2016
(Continued)

OTHER PUBLICATIONS

Jingfei Ma, et al., Linear Phase-Error Correction for Improved Water and Fat Separation in Dual-Echo Dixon Techniques, Magnetic Resonance in Medicine, 2008, pp. 1250-1255, vol. 60.
(Continued)

*Primary Examiner* — Rodneye E Fuller
(74) *Attorney, Agent, or Firm* — Bayramoglu Law Offices LLC

(57) ABSTRACT

An eddy-current correction method and apparatus, a mobile terminal and a readable storage medium are provided. The method includes: step S1: reading gradient-recalled echo sequence by means of bipolarity, so as to acquire a multi-echo image; step S2: estimating a first-order term coefficient of an extra phase term introduced by an eddy-current in the acquired multi-echo image; step S3: removing the estimated first-order term coefficient, and estimating a zero-order term coefficient of the extra phase term introduced by the eddy-current in the collected multi-echo image; step S4: removing, according to the estimated first-order term coefficient and the zero-order term coefficient, an error of the extra phase term introduced by the eddy-current. The eddy-cur- (Continued)

rent correction method removes the phase error caused by the eddy-current in the acquired image, thereby ensuring the correctness of the subsequent water-fat separation algorithm result.

11 Claims, 4 Drawing Sheets

(51) Int. Cl.
  *G01R 33/56* (2006.01)
  *G01R 33/48* (2006.01)

(56) References Cited

U.S. PATENT DOCUMENTS

| 6,249,595 | B1 | 6/2001 | Foxall et al. |
| 2002/0048340 | A1 | 4/2002 | Schaeffter et al. |
| 2013/0229177 | A1* | 9/2013 | Bammer ............... G01R 33/56 324/309 |

FOREIGN PATENT DOCUMENTS

| CN | 106353706 A | 1/2017 |
| CN | 107290700 A | 10/2017 |

OTHER PUBLICATIONS

C. B. Ahn, et al., A New Phase Correction Method in NMR Imaging Based on Autocorrelation and Histogram Analysis, IEEE Transactions on Medical Imaging, 1987, pp. 32-36, vol. MI-6 No.1.

Pernilla Peterson, et al., Fat Quantification Using Multiecho Sequences with Bipolar Gradients: Investigation of Accuracy and Noise Performance, Magnetic Resonance in Medicine, 2014, pp. 219-229, vol. 71.

Chao Zou, et al., Hierarchical iterative linear-fitting algorithm (HILA) for phase correction in fat quantification by bipolar multi-echo sequence, Quantitative Imaging in Medicine and Surgery, 2019, pp. 247-262, vol. 9 No. 2.

* cited by examiner

EDDY-CURRENT CORRECTION METHOD AND APPARATUS, MOBILE TERMINAL AND READABLE STORAGE MEDIUM

CROSS REFERENCE TO THE RELATED APPLICATIONS

This application is the national stage entry of International Application No. PCT/CN2017/113085, filed on Nov. 27, 2017, the entire contents of which are incorporated herein by reference.

TECHNICAL FIELD

The present application relates to the technical field of magnetic resonance sequence design, and in particular to a method and an apparatus for correcting an eddy current, a mobile terminal, and a readable storage medium.

BACKGROUND

Fat-water separation or fat quantification based on magnetic resonance imaging (MRI) has important clinical significance. A multi-echo gradient recalled echo (GRE) sequence is the most common MRI sequence used for water-fat separation. In such sequence, in order to reduce the echo spacing and repetition period, the bipolar readout gradient is usually used to acquire an multi-echo image, however, the bipolar readout method is always affected by the eddy current of the system, which makes phases of the odd and even echoes inconsistent, and the multi-echo data does not meet the theoretical water-fat mixing model, resulting in the failure of the subsequent water-fat separation algorithm based on a complex model.

Specifically, the theoretical water-fat mixture model containing two components (commonly water and fat) is established as follows:

$$S_n = \left(\rho_w + \rho_f \sum_{p=1}^{P} \alpha_p e^{-i2\pi f_{F,p} TE_n}\right) e^{-R_2^* TE_n} e^{-i2\pi f_B TE_n}, \quad (1)$$

$$n = 1, 2, K, N; N \geq 3$$

where $S_n$ represents a signal intensity under an echo time $TE_n$, N represents the number of echoes; $\rho_w$ and $\rho_f$ represent a signal intensity of water and a signal intensity of fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, the value of which is known; $f_B = \gamma \Delta B_0$ represents a local magnetic field strength, where $\gamma$ represents a hydrogen proton gyromagnetic ratio (42.576 MHz/T), and $R_2^*$ represents an apparent transverse relaxation rate.

Usually, the multi-echo GRE sequence is used to acquire the multi-echo image, as shown in FIG. 1. In order to increase the acquisition speed, the analog-to-digital converter is turned on for both positive and negative readout gradients to acquire the image. However, under such a bipolar readout mode, the eddy current caused by the rapid gradient switching will introduce inconsistence in the odd-numbered echo images and the even-numbered echo images, namely:

$$S_n = \begin{cases} \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\theta}, n = 1, 3, K \\ \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{i\theta}, n = 2, 4, K \end{cases} \quad (2)$$

where θ represent an eddy current induced extra phase term, which can be described by a first-order linear model:

$$\theta = \alpha x + \beta \quad (3)$$

where x represents a corresponding dimension of a frequency encoding direction in the image, since the eddy current induced phase θ is unknown, the direct use of the model (1) for the water-fat separation will lead to greater errors.

In the prior art, methods for tackling the phase error induced by the eddy current are summarized as follows:

For example, in method (1), the eddy current is taken as an unknown quantity, and the water, fat, and eddy current are solved simultaneously when the model is fitted. However, such an algorithm is relatively complicated and relies upon an accuracy of an initial value, and may easily converge to a local minimum, which leads to instability of the algorithm, as well as a large amount of point-by-point iteration.

For example, in method (2), reference acquisition is adopted to remove the phase error caused by the eddy current. Such method acquires additional data. The readout gradient corresponding to these data and the readout gradient corresponding to the original data have the same size and time sequence, but opposite polarities. The original data and the reference data are compared to obtain the phase error caused by the eddy current. After the phase error is removed from the original data, the subsequent fat quantitative calculation is performed. However, this algorithm requires additional acquisition of reference images and a long time.

For example, in method (3), which is similar to the method (2), one-to-many echo images are acquired, with the sequence having completely the same time sequence structure but opposite readout gradient polarities. After averaging, the influence of eddy current can be removed, and the subsequent fat quantitative calculation is performed. However, the scanning time is doubled and it takes a long time.

For example, in method (4), the first-order spatial model is used to approximate the eddy current, and the fat quantitative result obtained by the amplitude fitting is used as a standard to compare with the fat quantitative result obtained by the complex model after the eddy current correction, and when both the two are closest, the first-order model is used as the eddy current model. The amplitude fitting is not accurate when the water-fat ratio is close to 1:1.

For example, in method (5), an amplitude model is adopted to fit a water-fat model. However, the amplitude fitting is sensitive to noise and also sensitive to an error of a fat model.

In summary, none of the solutions provided by the prior art can simply and efficiently remove the eddy current induced phase error from the acquired multi-echo image, and thus failing to ensure the correctness of the water-fat separation algorithm.

SUMMARY

The present application provides a method and an apparatus for correcting an eddy current, a mobile terminal, and a readable storage medium, aiming at providing a simple and rapid method for eddy current correction which requires no additional data acquisition or multiple iterations, so as to remove the phase errors induced by the eddy current.

The present application provides a method for correcting an eddy current. The method comprises the steps of:

step S1, acquiring a multi-echo image by using a bipolar readout GRE sequence;

step S2, estimating a coefficient of a first-order term of an eddy current induced extra phase term in the acquired multi-echo image;

step S3, removing the estimated coefficient of the first-order term, and estimating a coefficient of a zero-order term of the eddy current induced extra phase term in the acquired multi-echo image; and step S4, removing an error of the eddy current induced extra phase term according to the estimated coefficient of the first-order term and the estimated coefficient of the zero-order term.

Furthermore, in step S1, the acquired multi-echo image at least comprises six multi-echo images, where a 1st, a 3rd, and a 5th echo images are defined as odd-numbered echoes, a 2nd, a 4th, and a 6th echo images are defined as even-numbered echoes, and a time interval between any two consecutive echoes acquired is equal.

Furthermore, the step S2 comprises:

step S21, searching, among the acquired multi-echo image, for pixels with a uniform tissue distribution in a spatial distribution, where the pixels satisfy the following conditions with n=1, 2, 3, . . . :

$$\text{abs}\{S_n(x, y, z)\} > t_1, \text{abs}\{S_n(x-1, y, z)\} > t_1$$

$$\delta_1 < \frac{\text{abs}\{S_n(x, y, z)\}}{\text{abs}\{S_n(x-1, y, z)\}} < \delta_2$$

where abs(.) represents an amplitude of a complex signal, $t_1$, $\delta_1$, and $\delta_2$ represent preset thresholds, (x, y, z) represents an image coordinate, and $S_n(x,y,z)$ represents a signal intensity at the coordinate (x, y, z) of an n-th echo;

step S22, performing spatial phase difference on the searched pixels, to obtain:

$$DX_n(x,y,z) = e^{i(-1)^n \alpha}, n=2,3 \ldots$$

and defining:

$$DX_n(x, y, z) = \frac{S_n(x, y, z)}{S_n(x-1, y, z)}$$

step S23, calculating the coefficient $\alpha$ of the first-order term of the eddy current induced extra phase term by combining with results obtained from the spatial phase difference, $$\alpha = \frac{1}{M} \text{angle}\left(\sum_m DX\right)$$

where m represents all the pixels searched out in step S21, and angle(.) represents a phase angle of a complex signal; and defining:

$$DX = \frac{DX_2 \cdot DX_4 \cdot \ldots}{DX_3 \cdot DX_5 \cdot \ldots} = e^{iM\alpha}$$

where M represents the number of $DX_n$ in the above formula.

Furthermore, the step S3 comprises:

step S31, removing the coefficient $\alpha$ of the first-order term of the eddy current induced extra phase term according to the following formula:

$$SC_n = S_n / e^{i(-1)^n \alpha x} =$$

$$\begin{cases} \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 1, 3, K \\ \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{i\beta}, n = 2, 4, K \end{cases}$$

where $S_n$ represents a signal intensity under an echo time $TE_n$, N represents the number of echoes; $\rho_w$ and $\rho_f$ represent a signal intensity of water and a signal intensity of fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, the value of which is known; $f_B = \gamma \Delta B_0$ represents a local magnetic field strength, where γ represents a hydrogen proton gyromagnetic ratio (42.576 MHz/T), $R_2^*$ represents an apparent transverse relaxation rate, and β represents the coefficient of the zero-order term of the eddy current induced extra phase term;

step S32, searching, among all the echo images having the coefficient of the first-order term removed, for pixels having high signal-to-noise ratios that satisfy the following condition:

$$\text{abs}\{SC_n(x,y,z)\} > t_1, \text{abs}\{SC_n(x-1,y,z)\} > t_1, n=1,2,3, \ldots$$

step S33, filtering out pixels satisfying a preset water-fat ratio from the pixels having high signal-to-noise ratios, which are searched out from first three even-numbered echo images:

first, selecting the first three even-numbered echo images:

$$I_1 = SC_2, I_2 = SC_4, I_3 = SC_6$$

and defining $$a_0 = e^{i2\pi\delta B_0 TE_1}$$

$$a = e^{i2\pi\delta B_0 \Delta TE}$$

$$b = e^{i2\pi f \beta \Delta TE}$$

where $\delta$ is a chemical shift difference between a fat peak and water, $B_0$ represents a main magnetic field strength, and $\Delta TE$ represents an echo time interval;

then, performing the following calculations with respect to the searched pixels having high signal-to-noise ratios:

$$b_1 = \frac{(a+1)I_2}{2aI_1} + \sqrt{\left[\frac{(a+1)I_2}{2aI_1}\right]^2 - \frac{I_3}{aI_1}}$$

$$b_2 = \frac{(a+1)I_2}{2aI_1} - \sqrt{\left[\frac{(a+1)I_2}{2aI_1}\right]^2 - \frac{I_3}{aI_1}}$$

$$R_{wf} = a_0 a \frac{b_1 - ab_2}{b_2 - ab_1}$$

finally, filtering out pixels that satisfy the following inequality;

$$R_{wf} > c1 \text{ or } R_{wf} < c2$$

where $R_{wf}$ represents a water-fat ratio, and c1 and c2 represent preset water-fat ratio constants;

step S34, performing the following calculation with respect to the filtered pixels satisfying the preset water-fat ratio:

$$D = \frac{SC_{2k+1} \cdot SC_{2k+1}}{SC_{2k} \cdot SC_{2k+2}}, \quad 1 < 2k < 2k+1 < 2k+2 \le N$$

and estimating the coefficient of the zero-order term of the eddy current induced extra phase term:

$$\beta = \frac{1}{4}\text{angle}\left(\sum_k D\right)$$

where k represents all the pixels filtered in step S33, and angle(.) represents a phase angle of a complex signal.

Furthermore, the step S4 comprises:

removing the error of the eddy current induced extra phase term to obtain corrected data $SE_n$ by combining with the estimated coefficient of the first-order term and the estimated coefficient of the zero-order term according to the following formula:

$$SE_n = S_n / e^{i(-1)^n(\alpha x + \beta)} = \left(\rho_w + \rho_f \sum_{p=1}^{P} \alpha_p e^{-i2\pi f_{F,p} TE_n}\right) e^{-R_2^* TE_n} e^{-i2\pi f_B TE_n},$$

$$n = 1, 2, \ldots N$$

where $S_n$ represents a signal intensity under an echo time $TE_n$, N represents the number of echoes; $\rho_w$ and $\rho_f$ represent a signal intensity of water and a signal intensity of fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, the value of which is known; $f_B = \gamma \Delta B_0$ represents a local magnetic field strength, where $\gamma$ represents a hydrogen proton gyromagnetic ratio (42.576 MHz/T), and $R_2^*$ represents an apparent transverse relaxation rate.

The present application also provides an apparatus for correcting an eddy current. The apparatus comprises:

an acquisition module, configured for acquiring a multi-echo image by using a bipolar readout GRE sequence;

a first estimation module, configured for estimating a coefficient of a first-order term of an eddy current induced extra phase term in the acquired multi-echo image;

a second estimation module, configured for removing the estimated coefficient of the first-order term, and estimating a coefficient of a zero-order term of the eddy current induced extra phase term in the acquired multi-echo image; and an error removal module, configured for removing an error of the eddy current induced extra phase term according to the estimated coefficient of the first-order term and the estimated coefficient of the zero-order term.

Furthermore, in the acquisition module, the acquired multi-echo image at least comprises six multi-echo images, where a 1st, a 3rd, and a 5th echo images are defined as odd-numbered echoes, a 2nd, a 4th, and a 6th echo images are defined as even-numbered echoes, and a time interval between any two consecutive echoes acquired is equal.

Furthermore, the first estimation module comprises:

a first searcher sub-module, configured for searching, among the acquired multi-echo image, for pixels with a uniform tissue distribution in a spatial distribution, where the pixels satisfy the following conditions with n=1, 2, 3, . . . :

$$\text{abs}\{S_n(x, y, z)\} > t_1, \text{abs}\{S_n(x-1, y, z)\} > t_1$$

$$\delta_1 < \frac{\text{abs}\{S_n(x, y, z)\}}{\text{abs}\{S_n(x-1, y, z)\}} < \delta_2$$

where abs(.) represents an amplitude of a complex signal, $t_1$, $\delta_1$, and $\delta_2$ represent preset thresholds, (x, y, z) represents an image coordinate, and $S_n(x,y,z)$ represents a signal intensity at the coordinate (x, y, z) of an n-th echo;

a spatial phase difference sub-module, configured for performing spatial phase difference on the searched pixels, to obtain:

$$DX_n(x,y,z) = e^{i(-1)^n \alpha}, n=2,3 \ldots$$

and defining:

$$DX_n(x, y, z) = \frac{S_n(x, y, z)}{S_n(x-1, y, z)}$$

a first-order term estimation sub-module, configured for calculating the coefficient a of the first-order term of the eddy current induced extra phase term by combining with results obtained from the spatial phase difference, $$\alpha = \frac{1}{M} \text{angle}\left(\sum_m DX\right)$$

where m represents all the pixels searched out by the first searcher sub-module, and angle(.) represents a phase angle of a complex signal;
and defining:

$$DX = \frac{DX_2 \cdot DX_4 \cdot \ldots}{DX_3 \cdot DX_5 \cdot \ldots} = e^{iM\alpha}$$

where M represents the number of $DX_n$ in the above formula.

Furthermore, the second estimation module comprises:
a first-order term removal sub-module, configured for removing the coefficient α of the first-order term of the eddy current induced extra phase term according to the following formula:

$$SC_n = S_n / e^{i(-1)^n \alpha x} =$$

$$\begin{cases} \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 1, 3, K \\ \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{i\beta}, n = 2, 4, K \end{cases}$$

where $S_n$ represents a signal intensity under an echo time $TE_n$, N represents the number of echoes; $\rho_w$ and $\rho_f$ represent a signal intensity of water and a signal intensity of fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, the value of which is known; $f_B = \gamma \Delta B_0$ represents a local magnetic field strength, where γ represents a hydrogen proton gyromagnetic ratio (42.576 MHz/T), $R_2^*$ represents an apparent transverse relaxation rate, and β represents the coefficient of the zero-order term of the eddy current induced extra phase term;

a second searcher sub-module, configured for searching, among all the echo images having the coefficient of the first-order term removed, for pixels having high signal-to-noise ratios that satisfy the following condition:

abs{$SC_n(x,y,z)$}>$t_1$,abs{$SC_n(x-1,y,z)$}>$t_1$,n=1,2,3,...

a filter sub-module, configured for filtering out pixels satisfying a preset water-fat ratio from the pixels having high signal-to-noise ratios, which are searched out from first three even-numbered echo images:
first, selecting the first three even-numbered echo images:

$I_1 = SC_2, I_2 = SC_4, I_3 = SC_6$ and defining $a_0 = e^{i2\pi\delta B_0 TE_1}$ $a = e^{i2\pi\delta B_0 \Delta TE}$ $b = e^{i2\pi f_B \Delta TE}$ where δ is a chemical shift difference between a fat peak and water, $B_0$ represents a main magnetic field strength, and ΔTE represents an echo time interval;
then, performing the following calculations with respect to the searched pixels having high signal-to-noise ratios:

$$b_1 = \frac{(a+1)I_2}{2aI_1} + \sqrt{\left[\frac{(a+1)I_2}{2aI_1}\right]^2 - \frac{I_3}{aI_1}}$$

$$b_2 = \frac{(a+1)I_2}{2aI_1} - \sqrt{\left[\frac{(a+1)I_2}{2aI_1}\right]^2 - \frac{I_3}{aI_1}}$$

$$R_{wf} = a_0 a \frac{b_1 - ab_2}{b_2 - ab_1}$$

finally, filtering out pixels that satisfy the following inequality;

$R_{wf} > c1$ or $R_{wf} < c2$ where $R_{wf}$ represents a water-fat ratio, and c1 and c2 represent preset water-fat ratio constants;
a zero-order term estimation sub-module, configured for performing the following calculation with respect to the filtered pixels satisfying the preset water-fat ratio:

$$D = \frac{SC_{2k+1} \cdot SC_{2k+1}}{SC_{2k} \cdot SC_{2k+2}}, \quad 1 < 2k < 2k+1 < 2k+2 \leq N$$

and estimating the coefficient of the zero-order term of the eddy current induced extra phase term:

$$\beta = \frac{1}{4} \text{angle}\left(\sum_k D\right)$$

where k represents all the pixels filtered by the filter sub-module, and angle(.) represents a phase angle of a complex signal.

Furthermore, the error removal module is configured for:
removing the error of the eddy current induced extra phase term to obtain corrected data $SE_n$ by combining with the estimated coefficient of the first-order term and the estimated coefficient of the zero-order term according to the following formula:

$$SE_n = S_n / e^{i(-1)^n(\alpha x + \beta)} = \left(\rho_w + \rho_f \sum_{p=1}^{P} \alpha_p e^{-i2\pi f_{F,p} TE_n}\right) e^{-R_2^* TE_n} e^{-i2\pi f_B TE_n},$$

$n = 1, 2, \ldots N$ where $S_n$ represents a signal intensity under an echo time $TE_n$, N represents the number of echoes; $\rho_w$ and $\rho_f$ represent a signal intensity of water and a signal intensity of fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, the value of which is known; $f_B = \gamma \Delta B_0$ represents a local magnetic field strength, where $\gamma$ represents a hydrogen proton gyromagnetic ratio (42.576 MHz/T), and $R_2^*$ represents an apparent transverse relaxation rate.

The present application also provides a mobile terminal, comprising: a memory, a processor, and a computer program stored in the memory and configured to run on the processor, where the processor implements the steps of the above-described method for correcting an eddy current when the executing the computer program.

The present application also provides a readable storage medium, being a computer readable storage medium where a computer program is stored, where the processor implements the steps of the above-described method for correcting an eddy current when the executing the computer program.

Compared with the prior art, the beneficial effects of the present application are summarized as follows: in the method and apparatus for correcting an eddy current, the mobile terminal, and the readable storage medium provided by embodiments of the present application, a multi-echo image is firstly acquired by using a bipolar readout GRE sequence; a coefficient of a first-order term of an eddy current induced extra phase term in the acquired multi-echo image is then estimated; after that, the estimated coefficient of the first-order term is removed, and a coefficient of a zero-order term of the eddy current induced extra phase term in the acquired multi-echo image is estimated; and finally, an error of the eddy current induced extra phase term is removed according to the estimated coefficient of the first-order term and the estimated coefficient of the zero-order term. Compared with the prior art, the present application firstly acquires the phase variation induced by the eddy current, and then removes the phase variation from the multi-echo image, thereby correcting the phase error caused by the eddy current, the water-fat separation algorithm may be subsequently applied to obtain the correct water-fat separation results. The technical solution provided by an embodiment of the present application does not require additional data acquisition, and the algorithm is simple and rapid and does not require multiple iterations.

DETAILED DESCRIPTION OF THE EMBODIMENTS

In order to make the objectives, technical solutions, and advantages of the present application clearer, the present application will be further explained in detail in combination with the drawings and embodiments. It should be understood that the specific embodiments described herein are only used to explain the present application, but not to limit the present application.

It is a technical problem existing in the prior art that it is impossible to simply and efficiently remove the phase error induced by the eddy current in the acquired multi-echo image, thus failing to ensure the correctness of the results obtained from the water-fat separation algorithm.

In order to solve the above technical problems, the present application provides a method and an apparatus for correcting an eddy current, a mobile terminal, and a readable storage medium. By adopting specific algorithms, the phase variation induced by the eddy current may be obtained, and the phase variation is removed in the multi-echo image, thus, the water-fat separation algorithm can be subsequently applied to obtain the correct water-fat separation results.

Figure 1:
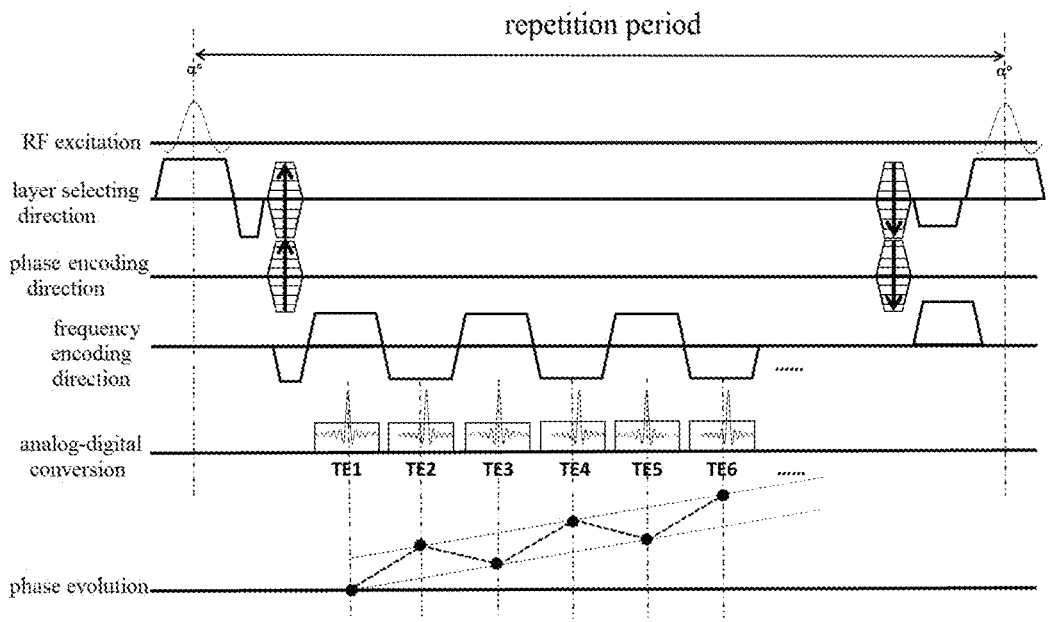
FIG. 1 is a sequence diagram of a multi-echo GRE sequence for water-fat separation/fat quantification provided by the prior art.
Figure 2:
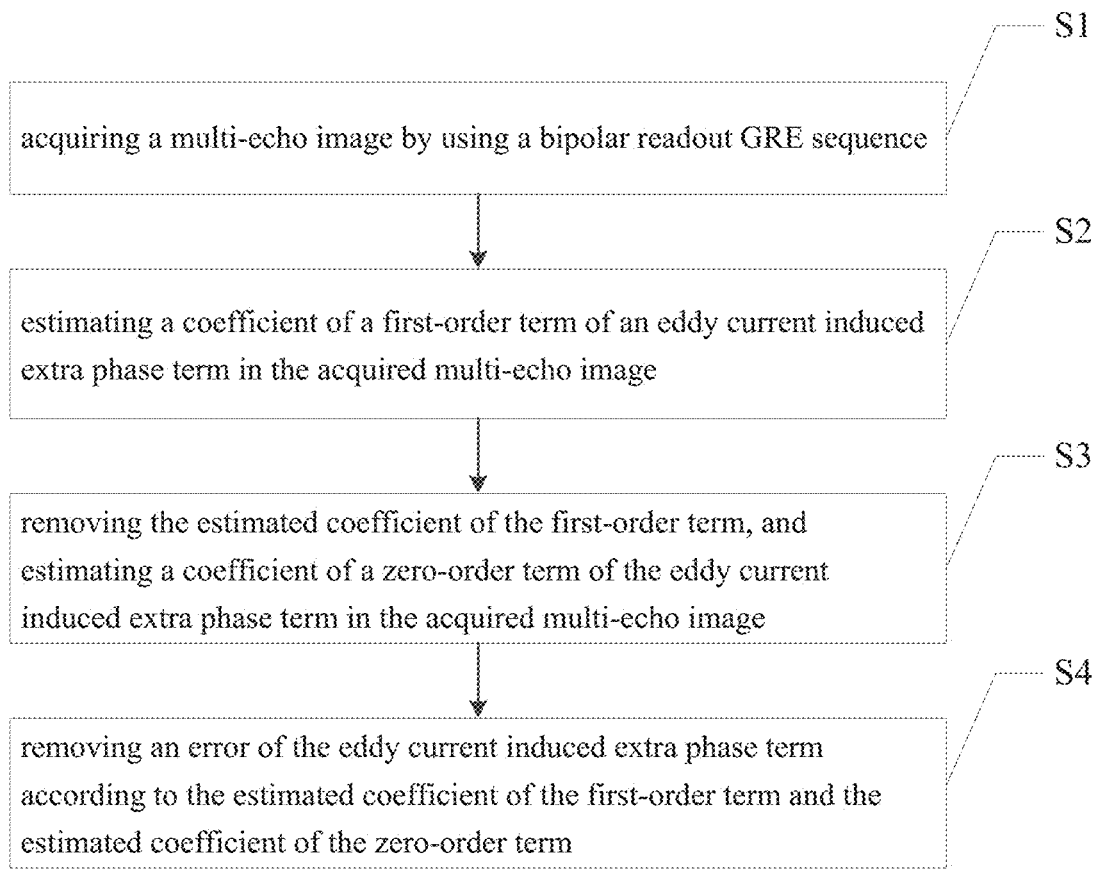
FIG. 2 is a schematic flowchart of a method for correcting an eddy current provided by an embodiment of the present application.

Referring to FIG. 2, which is a method for correcting an eddy current according to an embodiment of the present application. The method comprises:

Step S1, acquiring a multi-echo image by using a bipolar readout GRE sequence;

Specifically, FIG. 1 shows a sequence diagram of a multi-echo GRE sequence for water-fat separation/fat quantification provided by the prior art, in which, TEn represents an n-th echo time. In step S1, the multi-echo image is acquired according to the pulse sequence shown in FIG. 1, the acquired multi-echo image at least includes six echo images.

The acquired multi-echo image in an embodiment of the present application includes six echo images, where a 1st, a 3rd, and a 5th echo images are defined as odd-numbered echoes, a 2nd, a 4th, and a 6th echo images are defined as even-numbered echoes, and a time interval between any two consecutive echoes acquired is equal. It can be seen from FIG. 1 that due to the eddy current, the echo centers are inconsistent in the odd-numbered echoes and the even-numbered echoes. The lower part of FIG. 1 shows a schematic diagram of the phase evolution in the pure water point. Due to the existence of eddy currents, the phases of the water point at the odd and even echo time are not in a straight line, which deviates from the theoretical model.

Step S2, estimating a coefficient of a first-order term of an eddy current induced extra phase term in the acquired multi-echo image;

In particular, the step S2 comprises:

step S21, searching, among the acquired multi-echo image, for pixels with a uniform tissue distribution in a spatial distribution, wherein the pixels satisfy the following conditions with n=1, 2, 3, . . . :

$$\text{abs}\{S_n(x, y, z)\} > t_1, \text{abs}\{S_n(x-1, y, z)\} > t_1 \quad (4)$$

$$\delta_1 < \frac{\text{abs}\{S_n(x, y, z)\}}{\text{abs}\{S_n(x-1, y, z)\}} < \delta_2$$

where abs(.) represents an amplitude of a complex signal, $t_1$, $\delta_1$, and $\delta_2$ represent preset thresholds, $(x, y, z)$ represents an image coordinate, and $S_n(x,y,z)$ represents a signal intensity at the coordinate $(x, y, z)$ of an n-th echo (for a two-dimensional image, only $(x, y)$ coordinate is taken). Under the current setting, $t_1$ can be 0.02 times a maximum value of the signal intensity of Sn, $\delta_1$ may be 0.99, and $\delta_2$ may be 1.01.

step S22, performing spatial phase difference on the searched pixels, that is, calculating DX, to approximately obtain:

$$DX_n(x,y,z) = e^{i(-1)^n \alpha}, n=2,3 \ldots \quad (5)$$

and defining:

$$DX_n(x, y, z) = \frac{S_n(x, y, z)}{S_n(x-1, y, z)} \quad (6)$$

step S23, calculating the coefficient $\alpha$ of the first-order term of the eddy current induced extra phase term by combining with results obtained from the spatial phase difference, $$\alpha = \frac{1}{M} \text{angle}\left(\sum_m DX\right) \quad (7)$$

where m represents all the pixels satisfying formula (4), and angle(.) represents a phase angle of a complex signal; and
defining:

$$DX = \frac{DX_2 \cdot DX_4 \cdot \ldots}{DX_3 \cdot DX_5 \cdot \ldots} = e^{jM\alpha} \quad (8)$$

where M represents the number of $DX_n$ in the above formula.

Step S3, removing the estimated coefficient of the first-order term, and estimating a coefficient of a zero-order term of the eddy current induced extra phase term in the acquired multi-echo image.

In particular, the step S3 comprises:

S31, removing the coefficient $\alpha$ of the first-order term of the eddy current induced extra phase term according to the following formula: that is, removing the influence of the first-order term of the eddy current from (16):

$$SC_n = S_n / e^{i(-1)^n \alpha x} = \quad (9)$$

$$\begin{cases} \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 1, 3, K \\ \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 2, 4, K \end{cases}$$

where $S_n$ represents a signal intensity under an echo time $TE_n$, N represents the number of echoes; $\rho_w$ and $\rho_f$ represent a signal intensity of water and a signal intensity of fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, the value of which is known; $f_B = \gamma \Delta B_0$ represents a local magnetic field strength, where $\gamma$ represents a hydrogen proton gyromagnetic ratio (42.576 MHz/T), $R_2^*$ represents an apparent transverse relaxation rate, and $\beta$ represents the coefficient of the zero-order term of the eddy current induced extra phase term.

step S32, searching, among all the echo images having the coefficient of the first-order term removed, for pixels having high signal-to-noise ratios that satisfy the following condition:

$$\text{abs}\{SC_n(x,y,z)\} > t_1, \text{abs}\{SC_n(x-1,y,z)\} > t_1, n=1,2,3,\ldots \quad (10)$$

step S33, filtering out pixels satisfying a preset water-fat ratio from the pixels having high signal-to-noise ratios, which are searched out from first three even-numbered echo images:

Specifically, in this embodiment of the present application, the pixels satisfying the preset water-fat ratio are selected from the first three even-numbered echo images; in fact, the pixels satisfying the preset water-fat ratio may also be selected from the first three odd-numbered echo images.

first, selecting the first three even-numbered echo images:

$$I_1 = SC_2, I_2 = SC_4, I_3 = SC_6 \quad (11)$$

and defining $$a_0 = e^{i2\pi \delta B_0 TE_1}$$

$$a = e^{i2\pi \delta B_0 \Delta TE}$$

$$b = e^{i2\pi f_B \Delta TE} \quad (12)$$

where $\delta$ is a chemical shift difference (−3.5 ppm) between a fat peak and water, $B_0$ represents a main magnetic field strength, and $\Delta TE$ represents an echo time interval;

then, performing the following calculations with respect to the searched pixels having high signal-to-noise ratios:

$$b_1 = \frac{(a+1)I_2}{2aI_1} + \sqrt{\left[\frac{(a+1)I_2}{2aI_1}\right]^2 - \frac{I_3}{aI_1}} \quad (13)$$

$$b_2 = \frac{(a+1)I_2}{2aI_1} - \sqrt{\left[\frac{(a+1)I_2}{2aI_1}\right]^2 - \frac{I_3}{aI_1}}$$

$$R_{wf} = a_0 a \frac{b_1 - ab_2}{b_2 - ab_1}$$

finally, filtering out pixels that satisfy the following inequality;

$$R_{wf} > c1 \text{ or } R_{wf} < c2 \quad (14)$$

where $R_{wf}$ represents a water-fat ratio, and c1 and c2 represent preset water-fat ratio constants. In this embodiment of the present application, c1=0.95, and c2=0.05.

step S34, performing the following calculation with respect to the filtered pixels satisfying the preset water-fat ratio:

$$D = \frac{SC_{2k+1} \cdot SC_{2k+1}}{SC_{2k} \cdot SC_{2k+2}}, \quad 1 < 2k < 2k+1 < 2k+2 \leq N \quad (15)$$

and estimating the coefficient of the zero-order term of the eddy current induced extra phase term:

$$\beta = \frac{1}{4}\text{angle}\left(\sum_k D\right) \quad (16)$$

where k represents all the pixels satisfying formula (14), and angle(.) represents a phase angle of a complex signal.

Step S4, removing an error of the eddy current induced extra phase term according to the estimated coefficient of the first-order term and the estimated coefficient of the zero-order term.

Specifically, the step S4 comprises:

removing the error of the eddy current induced extra phase term to obtain corrected data $SE_n$ by combining with the estimated coefficient of the first-order term and the estimated coefficient of the zero-order term according to the following formula:

$$SE_n = S_n \Big/ e^{i(-1)^n(\alpha x + \beta)} = \quad (17)$$

$$\left(\rho_w + \rho_f \sum_{p=1}^{P} \alpha_p e^{-i2\pi f_{F,p} TE_n}\right) e^{-R_2^* TE_n} e^{-i2\pi f_B TE_n}, n = 1, 2, \ldots N$$

where $S_n$ represents a signal intensity under an echo time $TE_n$, N represents the number of echoes; $\rho_w$ and $\rho_f$ represent a signal intensity of water and a signal intensity of fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, the value of which is known; $f_B = \gamma \Delta B_0$ represents a local magnetic field strength, where γ represents a hydrogen proton gyromagnetic ratio (42.576 MHz/T), and $R_2^*$ represents an apparent transverse relaxation rate.

Specifically, in the subsequent fat quantification algorithm based on the complex model, the correct result can be obtained by using the data Sen after eddy current correction.

In the method for correcting an eddy current according to an embodiment of the present application, the phase error induced by the eddy current can be accurately estimated in the specific water-fat mixing model, thereafter, the phase error is removed from the multi-echo image, such that the phase error caused by the eddy current can be corrected, thus, the water-fat separation algorithm can be subsequently applied to obtain the correct water-fat separation results. The technical solution provided by an embodiment of the present application does not require additional data acquisition, the algorithm is simple and rapid and does not require multiple iterations.

Figure 3:
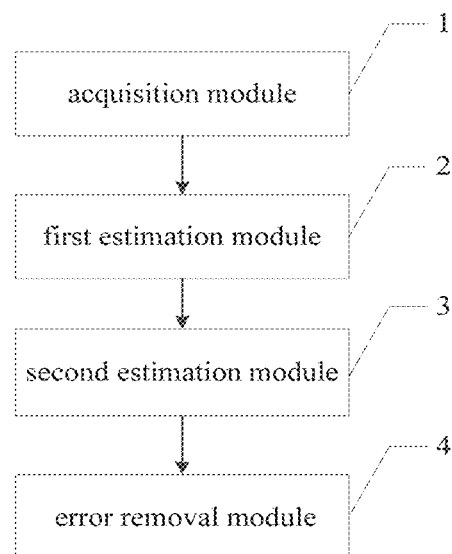
FIG. 3 is a schematic block diagram of an apparatus for correcting an eddy current provided by an embodiment of the present application.

Referring to FIG. 3, which is an apparatus for correcting an eddy current according to an embodiment of the present application. The apparatus comprises:

an acquisition module 1, which is configured for acquiring a multi-echo image by using a bipolar readout GRE sequence;

Specifically, in the acquisition module, the acquired multi-echo image at least comprises six multi-echo images, where a 1st, a 3rd, and a 5th echo images are defined as odd-numbered echoes, a 2nd, a 4th, and a 6th echo images are defined as even-numbered echoes, and a time interval between any two consecutive echoes acquired is equal.

a first estimation module 2, which is configured for estimating a coefficient of a first-order term of an eddy current induced extra phase term in the acquired multi-echo image;

Specifically, the first estimation module 2 comprises:

a first searcher sub-module, which is configured for searching, among the acquired multi-echo image, for pixels with a uniform tissue distribution in a spatial distribution, wherein the pixels satisfy the following conditions with n=1, 2, 3, . . . :

$$\text{abs}\{S_n(x, y, z)\} > t_1, \text{abs}\{S_n(x-1, y, z)\} > t_1 \quad (4)$$

$$\delta_1 < \frac{\text{abs}\{S_n(x, y, z)\}}{\text{abs}\{S_n(x-1, y, z)\}} < \delta_2$$

where abs(.) represents an amplitude of a complex signal, $t_1$, $\delta_1$, and $\delta_2$ represent preset thresholds, (x, y, z) represents an image coordinate, and $S_n(x,y,z)$ represents a signal intensity at the coordinate (x, y, z) of an n-th echo (for a two-dimensional image, only (x, y) coordinate is taken). Under the current setting, $t_1$ can be 0.02 times a maximum value of the signal intensity of Sn, $\delta_1$ may be 0.99, and $\delta_2$ may be 1.01.

a spatial phase difference sub-module, which is configured for performing spatial phase difference on the searched pixels, to obtain:

$$DX_n(x,y,z) = e^{i(-1)^n \alpha}, n=2,3 \ldots \quad (5)$$

and defining:

$$DX_n(x, y, z) = \frac{S_n(x, y, z)}{S_n(x-1, y, z)} \quad (6)$$

a first-order term estimation sub-module, which is configured for calculating the coefficient α of the first-order term of the eddy current induced extra phase term by combining with results obtained from the spatial phase difference, $$\alpha = \frac{1}{M}\text{angle}\left(\sum_m DX\right) \quad (7)$$

where m represents all the pixels satisfying the formula (1), and angle(.) represents a phase angle of a complex signal;

and defining:

$$DX = \frac{DX_2 \cdot DX_4 \cdot \ldots}{DX_3 \cdot DX_5 \cdot \ldots} = e^{iM\alpha} \quad (8)$$

where M represents the number of $DX_n$ in the above formula.

a second estimation module 3, which is configured for removing the estimated coefficient of the first-order term, and estimating a coefficient of a zero-order term of the eddy current induced extra phase term in the acquired multi-echo image;

Specifically, the second estimation module 3 comprises:

a first-order term removal sub-module, which is configured for removing the coefficient α of the first-order term of the eddy current induced extra phase term according to the following formula: that is, removing the influence of the first-order term of the eddy current from (16):

$$SC_n = S_n / e^{i(-1)^n \alpha x} = \quad (9)$$

$$\begin{cases} \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 1, 3, K \\ \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 2, 4, K \end{cases}$$

where $S_n$ represents a signal intensity under an echo time $TE_n$, N represents the number of echoes; $\rho_w$ and $\rho_f$ represent a signal intensity of water and a signal intensity of fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, the value of which is known; $f_B = \gamma \Delta B_0$ represents a local magnetic field strength, where γ represents a hydrogen proton gyromagnetic ratio (42.576 MHz/T), $R_2^*$ represents an apparent transverse relaxation rate, and β represents the coefficient of the zero-order term of the eddy current induced extra phase term;

a second searcher sub-module, which is configured for searching, among all the echo images having the coefficient of the first-order term removed, for pixels having high signal-to-noise ratios that satisfy the following condition:

$$abs\{SC_n(x,y,z)\} > t_1, abs\{SC_n(x-1,y,z)\} > t_1, n=1,2,3,\ldots \quad (10)$$

a filter sub-module, which is configured for filtering out pixels satisfying a preset water-fat ratio from the pixels having high signal-to-noise ratios, which are searched out from first three even-numbered echo images:

Specifically, in this embodiment of the present application, the pixels satisfying the preset water-fat ratio are selected from the first three even-numbered echo images; in fact, the pixels satisfying the preset water-fat ratio may also be selected from the first three odd-numbered echo images.

first, selecting the first three even-numbered echo images:

$$I_1 = SC_2, I_2 = SC_4, I_3 = SC_6 \quad (11)$$

and defining $$a_0 = e^{i2\pi\delta B_0 TE_1}$$

$$a = e^{i2\pi\delta B_0 \Delta TE} \quad (12)$$

$$b = e^{i2\pi f_B \Delta TE}$$

where δ is a chemical shift difference between a fat peak and water, $B_0$ represents a main magnetic field strength, and $\Delta TE$ represents an echo time interval;

then, performing the following calculations with respect to the searched pixels having high signal-to-noise ratios:

$$b_1 = \frac{(a+1)I_2}{2aI_1} + \sqrt{\left[\frac{(a+1)I_2}{2aI_1}\right]^2 - \frac{I_3}{aI_1}} \quad (13)$$

$$b_2 = \frac{(a+1)I_2}{2aI_1} - \sqrt{\left[\frac{(a+1)I_2}{2aI_1}\right]^2 - \frac{I_3}{aI_1}}$$

$$R_{wf} = a_0 a \frac{b_1 - ab_2}{b_2 - ab_1}$$

finally, filtering out pixels that satisfy the following inequality;

$$R_{wf} > c1 \text{ or } R_{wf} < c2 \quad (14)$$

where $R_{wf}$ represents a water-fat ratio, and c1 and c2 represent preset water-fat ratio constants. In this embodiment of the present application, c1=0.95, and c2=0.05.

a zero-order term estimation sub-module, which is configured for performing the following calculation with respect to the filtered pixels satisfying the preset water-fat ratio:

$$D = \frac{SC_{2k+1} \cdot SC_{2k+1}}{SC_{2k} \cdot SC_{2k+2}}, \quad 1 < 2k < 2k+1 < 2k+2 \leq N \quad (15)$$

and estimating the coefficient of the zero-order term of the eddy current induced extra phase term:

$$\beta = \frac{1}{4} \text{angle}\left(\sum_k D\right) \quad (16)$$

where k represents all the pixels satisfying the formula (11), and angle(.) represents a phase angle of a complex signal.

an error removal module 4, which is configured for removing an error of the eddy current induced extra phase term according to the estimated coefficient of the first-order term and the estimated coefficient of the zero-order term.

Specifically, the error removal module is configured for:

removing the error of the eddy current induced extra phase term to obtain corrected data $SE_n$ by combining with the estimated coefficient of the first-order term and the estimated coefficient of the zero-order term according to the following formula:

$$SE_n = S_n / e^{i(-1)^n(\alpha x + \beta)} = \quad (17)$$

$$\left(\rho_w + \rho_f \sum_{p=1}^{P} \alpha_p e^{-i2\pi f_{F,p} TE_n}\right) e^{-R_2^* TE_n} e^{-i2\pi f_B TE_n}, n = 1, 2, \ldots N$$

where $S_n$ represents a signal intensity under an echo time $TE_n$, N represents the number of echoes; $\rho_w$ and $\rho_f$ represent a signal intensity of water and a signal intensity of fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, the value of which is known; $f_B = \gamma \Delta B_0$ represents a local magnetic field strength, where $\gamma$ represents a hydrogen proton gyromagnetic ratio (42.576 MHz/T), and $R_2^*$ represents an apparent transverse relaxation rate.

Specifically, in the subsequent fat quantification algorithm based on the complex model, the correct result can be obtained by using the data Sen after eddy current correction.

Figure 4A:
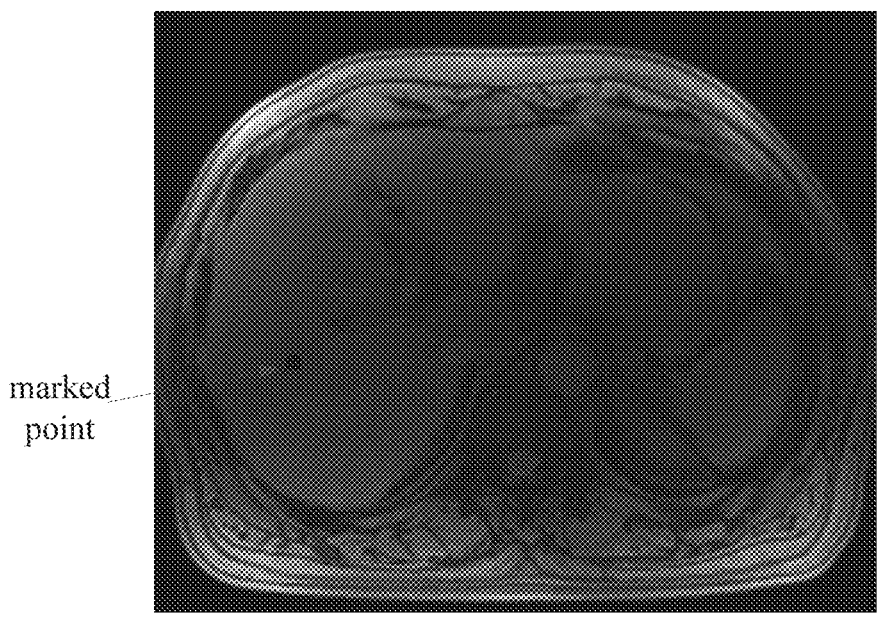
FIG. 4A is an image of a human liver acquired by adopting a multi-echo GRE sequence provided by an embodiment of the present application.
Figure 4B:
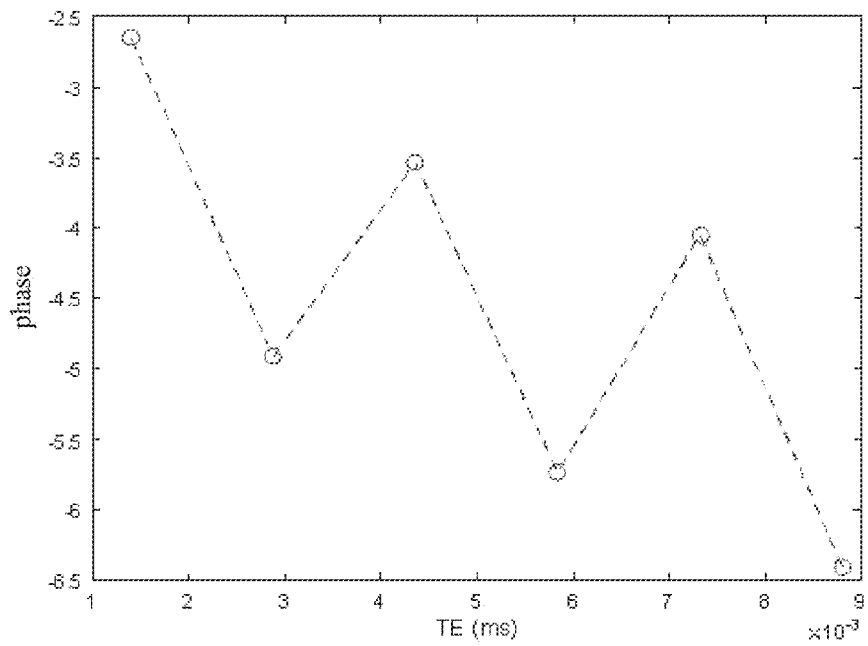
FIG. 4B is a schematic diagram of phase values of six echoes at a marked point in FIG. 4A before the eddy current correction provided by an embodiment of the present application.
Figure 4C:
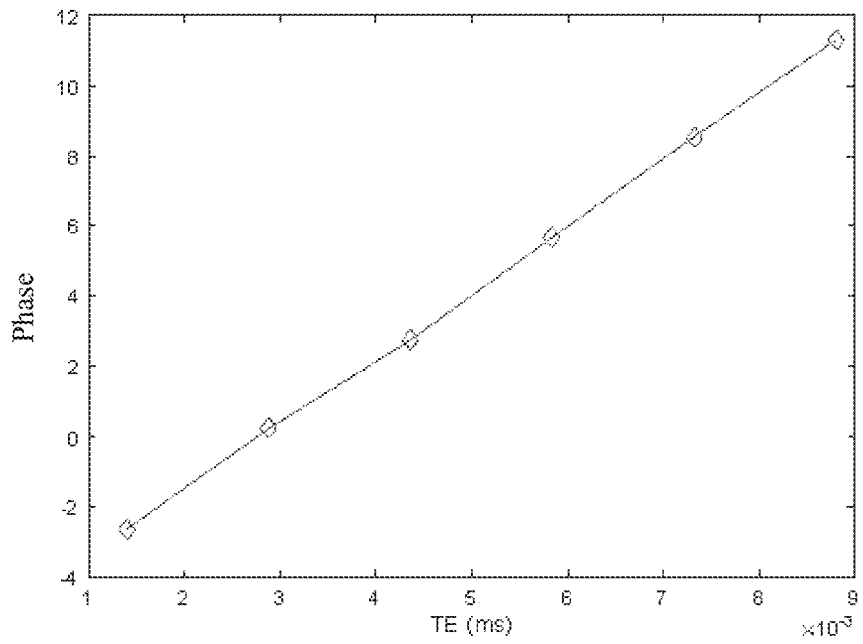
FIG. 4C is a schematic diagram of the phase values of the six echoes at the marked point in FIG. 4A after the eddy current correction provided by an embodiment of the present application.
Figure 4D:
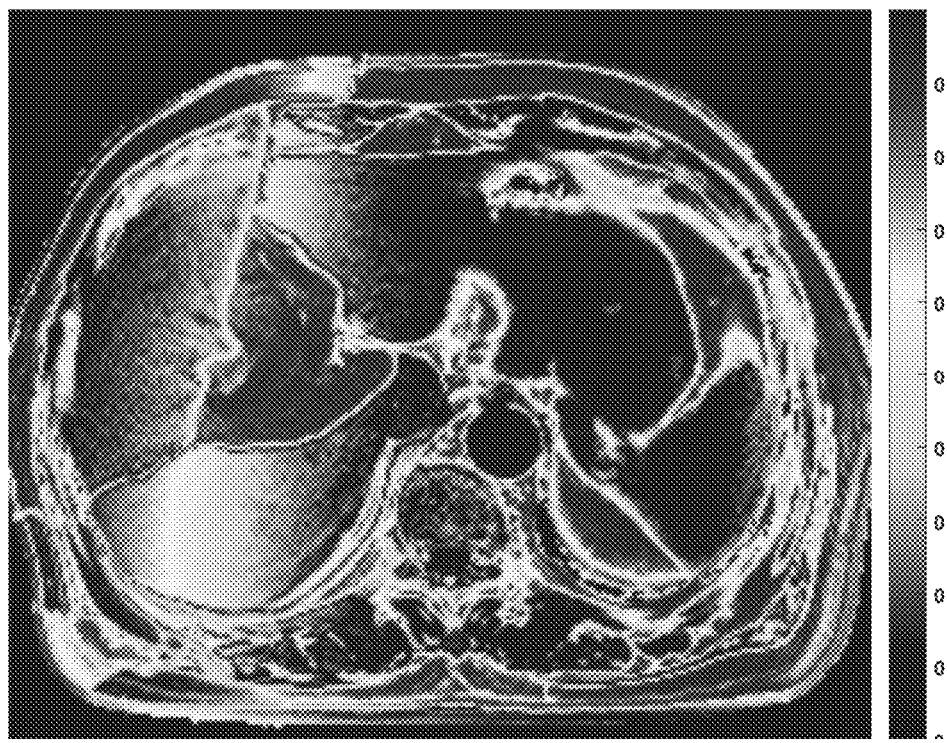
FIG. 4D is a schematic diagram of fat quantitative results before the eddy current correction provided by an embodiment of the present application.
Figure 4E:
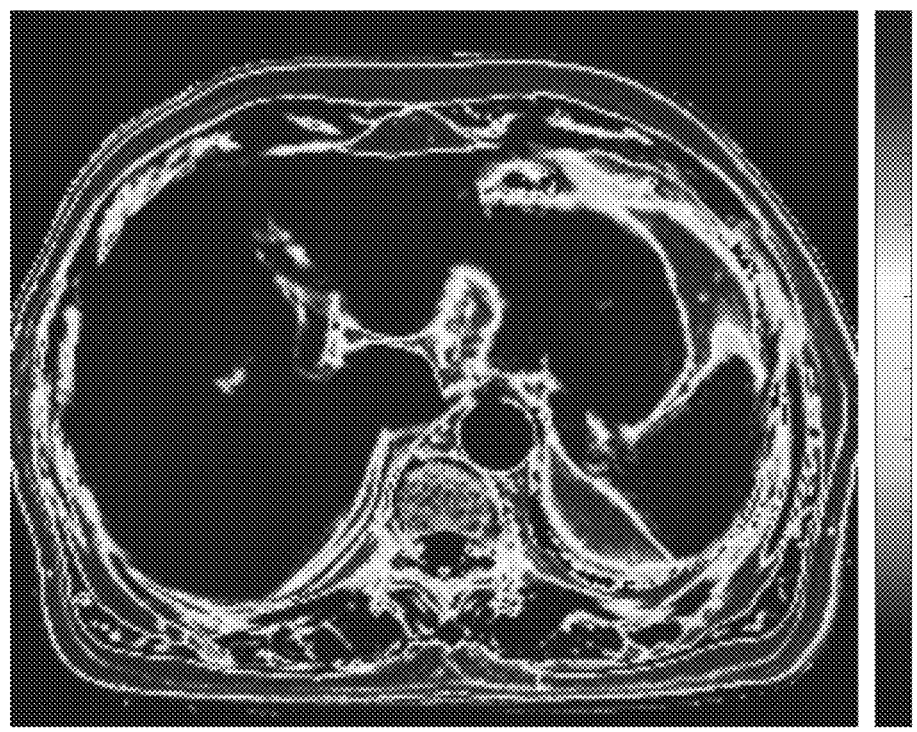
FIG. 4E is a schematic diagram of fat quantitative results after the eddy current correction provided by an embodiment of the present application.

As shown in FIG. 4A, which is a human liver image (TE=1.4 ms image) acquired by using a multi-echo GRE sequence provided by an embodiment of the present application. FIG. 4B shows phase values of six echoes at a marked point in FIG. 4A before the eddy current correction, it can be seen that the marked point is obviously affected by the eddy current, and the odd-numbered echoes (1, 3, 5) and even-numbered echoes (2, 4, 6) have phase discontinuities. FIG. 4C shows phase values of the six echoes at the marked point in FIG. 4A after the eddy current correction, it can be seen that the phase inconsistency caused by the eddy current at this point has been corrected. FIG. 4D shows a fat quantitative result before the eddy current correction, a lot of errors exist in the left half part of the figure. FIG. 4E is the fat quantitative result after the eddy current correction.

An embodiment of the present application further provides a mobile terminal, comprising: a memory, a processor, and a computer program stored in the memory and configured to run on the processor. The processor implements the steps of a method for correcting an eddy current according to an embodiment of the present application when the executing the computer program.

An embodiment of the present application further provides a readable storage medium. The readable storage medium is a computer readable storage medium where a computer program is stored. The processor implements the steps of a method for correcting an eddy current according to an embodiment of the present application when the executing the computer program.

The above descriptions are only preferred embodiments of the present application and are not intended to limit the present application. Any modification, equivalent replacement, and improvement made within the spirit and principle of the present application shall be included within the protection range of the present application.

What is claimed is:

1. A method for correcting an eddy current, comprising the steps of:
   step S1, acquiring a multi-echo image by using a bipolar readout gradient recalled echo (GRE) sequence;
   step S2, estimating a coefficient of a first-order term of an eddy current induced extra phase term in the multi-echo image;
   step S3, removing the coefficient of the first-order term, and estimating a coefficient of a zero-order term of the eddy current induced extra phase term in the multi-echo image; and
   step S4, removing an error of the eddy current induced extra phase term according to the coefficient of the first-order term and the coefficient of the zero-order term.

2. The method for correcting the eddy current of claim 1, wherein in step S1, the multi-echo image at least comprises six multi-echo images, wherein a first echo image, a third echo image, and a fifth echo image of the six multi-echo images are defined as odd-numbered echoes, a second echo image, a fourth echo image, and a sixth echo image of the six multi-echo images are defined as even-numbered echoes, and a time interval between two consecutive echoes of the six multi-echo images is equal.

3. The method for correcting the eddy current of claim 1, wherein the step S2 comprises:
   step S21, searching, among the multi-echo image, for pixels with a uniform tissue distribution in a spatial distribution, wherein the pixels satisfy the following conditions with n=1, 2, 3, . . . :

$$\text{abs}\{S_n(x, y, z)\} > t_1, \text{abs}\{S_n(x-1, y, z)\} > t_1$$

$$\delta_1 < \frac{\text{abs}\{S_n(x, y, z)\}}{\text{abs}\{S_n(x-1, y, z)\}} < \delta_2$$

where abs(.) represents an amplitude of a complex signal, $t_1$, $\delta_1$, and $\delta_2$ represent preset thresholds, (x, y, z) represents an image coordinate, and $S_n(x,y,z)$ represents a signal intensity at the image coordinate (x, y, z) of an n-th echo image of the multi-echo image;

step S22, performing a spatial phase difference on the pixels, to obtain:

$$DX_n(x,y,z) = e^{i(-1)^n \alpha}, n=2,3 \ldots$$

and defining:

$$DX_n(x, y, z) = \frac{S_n(x, y, z)}{S_n(x-1, y, z)}$$

step S23, calculating the coefficient $\alpha$ of the first-order term of the eddy current induced extra phase term by combining with results obtained from the spatial phase difference, $$\alpha = \frac{1}{M} \text{angle}\left(\sum_m DX\right)$$

where m represents all the pixels searched out in step S21, and angle(.) represents a phase angle of the complex signal; and defining:

$$DX = \frac{DX_2 \cdot DX_4 \cdot \ldots}{DX_3 \cdot DX_5 \cdot \ldots} = e^{iM\alpha}$$

where M represents a number of $DX_n$ in the formula.

4. The method for correcting the eddy current of claim 1, wherein the step S3 comprises:

step S31, removing the coefficient α of the first-order term of the eddy current induced extra phase term according to the following formula:

$$SC_n = S_n \big/ e^{i(-1)^n \alpha x} =$$

$$\begin{cases} \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 1, 3, K \\ \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 2, 4, K \end{cases}$$

where $S_n$ represents a signal intensity under an echo time $TE_n$, N represents a number of echoes; $\rho_w$ and $\rho_f$ represent a signal intensity of water and a signal intensity of a fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, a value of $f_{F,p}$ is known; $f_B = \gamma \Delta B_0$ represents a local magnetic field strength, where γ represents a hydrogen proton gyromagnetic ratio (42.576 MHz/T), $R_2^*$ represents an apparent transverse relaxation rate, and β represents the coefficient of the zero-order term of the eddy current induced extra phase term;

step S32, searching, among all echo images having the coefficient of the first-order term removed, for pixels having high signal-to-noise ratios that satisfy the following condition:

abs{$SC_n(x,y,z)$}>$t_1$,abs{$SC_n(x-1,y,z)$}>$t_1$,n=1,2,3,...

step S33, filtering out pixels satisfying a preset water-fat ratio from the pixels having the high signal-to-noise ratios, wherein the pixels having the high signal-to-noise ratios are searched out from first three even-numbered echo images:

first, selecting the first three even-numbered echo images:

$I_1 = SC_2, I_2 = SC_4, I_3 = SC_6$ and defining $a_0 = e^{i2\pi\delta B_0 TE_1}$ $a = e^{i2\pi\delta B_0 \Delta TE}$ $b = e^{i2\pi f_B \Delta TE}$ where δ is a chemical shift difference between a fat peak and water, $B_0$ represents a main magnetic field strength, and ΔTE represents an echo time interval;

then, performing the following calculations with respect to the pixels having the high signal-to-noise ratios:

$$b_1 = \frac{(a+1)I_2}{2aI_1} + \sqrt{\left[\frac{(a+1)I_2}{2aI_1}\right]^2 - \frac{I_3}{aI_1}}$$

$$b_2 = \frac{(a+1)I_2}{2aI_1} - \sqrt{\left[\frac{(a+1)I_2}{2aI_1}\right]^2 - \frac{I_3}{aI_1}}$$

$$R_{wf} = a_0 a \frac{b_1 - ab_2}{b_2 - ab_1}$$

finally, filtering out pixels satisfying the following inequality;

$R_{wf}$>c1 or $R_{wf}$<c2 where $R_{wf}$ represents a water-fat ratio, and c1 and c2 represent water-fat ratio constants; step S34, performing the following calculation with respect to the pixels satisfying the preset water-fat ratio:

$$D = \frac{SC_{2k+1} \cdot SC_{2k+1}}{SC_{2k} \cdot SC_{2k+2}}, \quad 1 < 2k < 2k+1 < 2k+2 \leq N$$

and estimating the coefficient of the zero-order term of the eddy current induced extra phase term:

$$\beta = \frac{1}{4} angle\left(\sum_k D\right)$$

where k represents all the pixels filtered in step S33, and angle(.) represents a phase angle of a complex signal.

5. The method for correcting the eddy current of claim 1, wherein the step S4 comprises:

removing the error of the eddy current induced extra phase term to obtain corrected data $SE_n$ by combining with the coefficient of the first-order term and the coefficient of the zero-order term according to the following formula:

$$SE_n = S_n \big/ e^{i(-1)^n(\alpha x + \beta)} = \left(\rho_w + \rho_f \sum_{p=1}^{P} \alpha_p e^{-i2\pi f_{F,p} TE_n}\right) e^{-R_2^* TE_n} e^{-i2\pi f_B TE_n},$$

$$n = 1, 2, \ldots N$$

where $S_n$ represents a signal intensity under an echo time $TE_n$, N represents a number of echoes; $\rho_w$ and $\rho_f$ represent a signal intensity of water and a signal intensity of a fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, a value of $f_{F,p}$ is known; $f_B = \gamma \Delta B_0$ represents a local magnetic field strength, where γ represents a hydrogen proton gyromagnetic ratio (42.576 MHz/T), and $R_2^*$ represents an apparent transverse relaxation rate.

6. A mobile terminal, comprising: a memory, a processor, and a computer program stored in the memory and configured to run on the processor, wherein the processor implements the steps of the method for correcting the eddy current of claim 1 when executing the computer program.

7. An apparatus for correcting an eddy current, comprising:
  an acquisition module, wherein the acquisition module is configured for acquiring a multi-echo image by using a bipolar readout gradient recalled echo (GRE) sequence;
  a first estimation module, wherein the first estimation module is configured for estimating a coefficient of a first-order term of an eddy current induced extra phase term in the multi-echo image;
  a second estimation module, wherein the second estimation module is configured for removing the coefficient of the first-order term, and estimating a coefficient of a zero-order term of the eddy current induced extra phase term in the multi-echo image; and
  an error removal module, wherein the error removal module is configured for removing an error of the eddy current induced extra phase term according to the coefficient of the first-order term and the coefficient of the zero-order term.

8. The apparatus for correcting the eddy current of claim 7, wherein in the acquisition module, the multi-echo image at least comprises six multi-echo images, wherein a first echo image, a third echo image, and a fifth echo image of the six multi-echo images are defined as odd-numbered echoes, a second echo image, a fourth echo image, and a sixth echo image of the six multi-echo images are defined as even-numbered echoes, and a time interval between two consecutive echoes of the six multi-echo images is equal.

9. The apparatus for correcting the eddy current of claim 7, wherein the first estimation module comprises:
  a first searcher sub-module, wherein the first searcher sub-module is configured for searching, among the multi-echo image, for pixels with a uniform tissue distribution in a spatial distribution, wherein the pixels satisfy the following conditions with n=1, 2, 3, . . . :

$$\text{abs}\{S_n(x, y, z)\} > t_1, \text{abs}\{S_n(x-1, y, z)\} > t_1$$

$$\delta_1 < \frac{\text{abs}\{S_n(x, y, z)\}}{\text{abs}\{S_n(x-1, y, z)\}} < \delta_2$$

where abs(.) represents an amplitude of a complex signal, $t_1$, $\delta_1$, and $\delta_2$ represent preset thresholds, (x, y, z) represents an image coordinate, and $S_n(x,y,z)$ represents a signal intensity at the image coordinate (x, y, z) of an n-th echo image of the multi-echo image;
  a spatial phase difference sub-module, wherein the spatial phase difference sub-module is configured for performing a spatial phase difference on the pixels, to obtain:

$$DX_n(x,y,z) = e^{i(-1)^n \alpha}, n=2,3 \ldots$$

and defining:

$$DX_n(x, y, z) = \frac{S_n(x, y, z)}{S_n(x-1, y, z)}$$

a first-order term estimation sub-module, wherein the first-order term estimation sub-module is configured for calculating the coefficient α of the first-order term of the eddy current induced extra phase term by combining with results obtained from the spatial phase difference, $$\alpha = \frac{1}{M} \text{angle}\left(\sum_m DX\right)$$

where m represents all the pixels searched out by the first searcher sub-module, and angle(.) represents a phase angle of the complex signal;
and defining:

$$DX = \frac{DX_2 \cdot DX_4 \cdot \ldots}{DX_3 \cdot DX_5 \cdot \ldots} = e^{iM\alpha}$$

where M represents a number of $DX_n$ in the formula.

10. The apparatus for correcting the eddy current of claim 7, wherein the second estimation module comprises:
  a first-order term removal sub-module, wherein the first-order term removal sub-module is configured for removing the coefficient α of the first-order term of the eddy current induced extra phase term according to the following formula:

$$SC_n = S_n / e^{i(-1)^n \alpha x} =$$

$$\begin{cases} \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 1, 3, K \\ \left(\rho_w + \rho_f \sum_{p=1}^{P} \alpha_p e^{-i2\pi f_{F,p} TE_n}\right) e^{-R_2^* TE_n} e^{-i2\pi f_B TE_n} e^{-i\beta}, n = 2, 4, K \end{cases}$$

where $S_n$ represents a signal intensity under an echo time $TE_n$, N represents a number of echoes; $\rho_w$ and $\rho_f$ represent a signal intensity of water and a signal intensity of a fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, a value of $f_{F,p}$ is known; $f_B = \gamma \Delta B_0$ represents a local magnetic field strength, where γ represents a hydrogen proton gyromagnetic ratio (42.576 MHz/T), $R_2^*$ represents an apparent transverse relaxation rate, and β represents the coefficient of the zero-order term of the eddy current induced extra phase term;
  a second searcher sub-module, wherein the second searcher sub-module is configured for searching, among all echo images having the coefficient of the first-order term removed, for pixels having high signal-to-noise ratios that satisfy the following condition:

$$\text{abs}\{SC_n(x,y,z)\} > t_1, \text{abs}\{SC_n(x-1,y,z)\} > t_1, n=1,2,3, \ldots$$

a filter sub-module, wherein the filter sub-module is configured for filtering out the pixels satisfying a preset water-fat ratio from the pixels having the high signal-to-noise ratios, wherein the pixels having the high signal-to-noise ratios are searched out from first three even-numbered echo images:

first, selecting the first three even-numbered echo images:

$I_1=SC_2, I_2=SC_4, I_3=SC_6$ and defining $a_0 = e^{i2\pi\delta B_0 TE_1}$ $a = e^{i2\pi\delta B_0 \Delta TE}$ $b = e^{i2\pi f \beta \Delta TE}$ where δ is a chemical shift difference between a fat peak and water, $B_0$ represents a main magnetic field strength, and ΔTE represents an echo time interval;

then, performing the following calculations with respect to the pixels having the high signal-to-noise ratios:

$$b_1 = \frac{(a+1)I_2}{2aI_1} + \sqrt{\left[\frac{(a+1)I_2}{2aI_1}\right]^2 - \frac{I_3}{aI_1}}$$

$$b_2 = \frac{(a+1)I_2}{2aI_1} - \sqrt{\left[\frac{(a+1)I_2}{2aI_1}\right]^2 - \frac{I_3}{aI_1}}$$

$$R_{wf} = a_0 a \frac{b_1 - ab_2}{b_2 - ab_1}$$

finally, filtering out pixels satisfying the following inequality;

$R_{wf} > c1$ or $R_{wf} < c2$ where $R_{wf}$ represents a water-fat ratio, and c1 and c2 represent preset water-fat ratio constants;

a zero-order term estimation sub-module, wherein the zero-order term estimation sub-module is configured for performing the following calculation with respect to the pixels satisfying the preset water-fat ratio:

$$D = \frac{SC_{2k+1} \cdot SC_{2k+1}}{SC_{2k} \cdot SC_{2k+2}}, \quad 1 < 2k < 2k+1 < 2k+2 \leq N$$

and estimating the coefficient of the zero-order term of the eddy current induced extra phase term:

$$\beta = \frac{1}{4} angle\left(\sum_k D\right)$$

where k represents all the pixels filtered by the filter sub-module, and angle(.) represents a phase angle of a complex signal.

11. The apparatus for correcting the eddy current of claim 7, wherein the error removal module is configured for:

removing the error of the eddy current induced extra phase term to obtain corrected data $SE_n$ by combining with the coefficient of the first-order term and the coefficient of the zero-order term according to the following formula:

$$SE_n = S_n / e^{i(-1)^n(\alpha x + \beta)} = \left(\rho_w + \rho_f \sum_{p=1}^{P} \alpha_p e^{-i2\pi f_{F,p} TE_n}\right) e^{-R_2^* TE_n} e^{-i2\pi f_B TE_n},$$

$$n = 1, 2, \ldots N$$

where $S_n$ represents a signal intensity under an echo time $TE_n$, N represents a number of echoes; $\rho_w$ and $\rho_f$ represent a signal intensity of water and a signal intensity of a fat, respectively; the fat contains a number of P peak components, with each component corresponds to a relative amplitude of $\alpha_p$ and satisfying $$\sum_{p=1}^{P} \alpha_p = 1,$$

$f_{F,p}$ represents a corresponding chemical shift, a value of $f_{F,p}$ is known; $f_B = \gamma \Delta B_0$ represents a local magnetic field strength, where γ represents a hydrogen proton gyromagnetic ratio (42.576 MHz/T), and $R_2^*$ represents an apparent transverse relaxation rate.

* * * * *